(12) United States Patent
Claassen et al.

(10) Patent No.: US 7,660,116 B2
(45) Date of Patent: Feb. 9, 2010

(54) RACK WITH INTEGRATED REAR-DOOR HEAT EXCHANGER

(75) Inventors: Alan Claassen, Fremont, CA (US); Eric Alan Eckberg, Rochester, MN (US); Dennis John Hansen, Rochester, MN (US); Vinod Kamath, Raleigh, NC (US); Madhusudan K. Iyengar, Woodstock, NY (US); Howard Victor Mahaney, Jr., Cedar Park, TX (US); Michael Sven Miller, Raleigh, NC (US); Stephen Peter Mroz, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/107,010

(22) Filed: Apr. 21, 2008

(65) Prior Publication Data

US 2009/0262501 A1    Oct. 22, 2009

(51) Int. Cl.
*H05K 7/20* (2006.01)
(52) U.S. Cl. .................... 361/696; 165/80.4; 361/695; 454/184
(58) Field of Classification Search .......... 361/701
See application file for complete search history.

(56) References Cited

U.S. PATENT DOCUMENTS

| 4,535,386 A | 8/1985 | Frey, Jr. et al. |
| 5,467,250 A | 11/1995 | Howard et al. |
| 6,164,369 A * | 12/2000 | Stoller ............... 165/104.33 |
| 6,819,563 B1 * | 11/2004 | Chu et al. ............... 361/696 |
| 6,924,981 B2 | 8/2005 | Chu et al. |
| 7,312,993 B2 | 12/2007 | Bundza et al. |

(Continued)

FOREIGN PATENT DOCUMENTS

| WO | WO 2006081857 | 8/2006 |
| WO | WO 2006137091 | 12/2006 |

OTHER PUBLICATIONS

Vinod Kamath, Rear Door Heat Exchanger—A method for DataCenter Thermal Management, Sep. 16, 2005, http://www-03.ibm.com/procurement/proweb.nsf/objectdocswebview/file12+-+kamath+rear+door+heat+exchanger/$file12+kamath+rear+door+heat+exchanger.pdf.

*Primary Examiner*—Gregory D Thompson
(74) *Attorney, Agent, or Firm*—Cynthia G. Seal; Jeffrey L. Streets

(57) ABSTRACT

Rack assemblies and methods for cooling one or more rack-based computer systems, as well as data center configurations that utilize the rack assembly. The rack assembly comprises a rack providing support for multiple columns of heat-generating electronic devices and device fans for moving air from an air inlet side of the rack through the devices and through an air outlet side of the rack. The rack assembly also comprises a unitary door having a support frame spanning the air outlet side of the rack and hingedly coupling the door to a rear vertical edge of the rack. The door includes an air-to-liquid heat exchanger panel spanning an air outlet passage inside the support frame so that substantially all of the air passing through the air outlet must pass through the heat exchanger panel. The air outlet passage has a cross-sectional area that is substantially equal to or greater than the cross-sectional area of the multiple columns of heat-generating devices.

23 Claims, 10 Drawing Sheets

U.S. PATENT DOCUMENTS

| | | | |
|---|---|---|---|
| 7,397,661 B2 * | 7/2008 | Campbell et al. | 361/696 |
| 2004/0100770 A1 * | 5/2004 | Chu et al. | 361/698 |
| 2004/0221604 A1 * | 11/2004 | Ota et al. | 62/259.2 |
| 2005/0235671 A1 * | 10/2005 | Belady et al. | 62/259.2 |
| 2006/0065000 A1 * | 3/2006 | Belady | 62/259.2 |
| 2006/0232945 A1 * | 10/2006 | Chu et al. | 361/724 |
| 2007/0019391 A1 | 1/2007 | Xu | |
| 2008/0018212 A1 * | 1/2008 | Spearing et al. | 312/236 |
| 2008/0158815 A1 * | 7/2008 | Campbell et al. | 361/696 |
| 2008/0174961 A1 * | 7/2008 | Campbell et al. | 361/698 |
| 2008/0233069 A1 * | 9/2008 | Tamareselvy et al. | 424/70.11 |

* cited by examiner

RACK WITH INTEGRATED REAR-DOOR HEAT EXCHANGER

BACKGROUND OF THE INVENTION

1. Field of the Invention

The present invention relates to cooling computer systems and to the configuration of a datacenter according to how computer equipment is cooled.

2. Description of the Related Art

Computer systems use electrical energy and produce heat as a byproduct of electrical resistance. Rack-based computer systems include many rack-mounted components in a high-density arrangement, which can produce a considerable amount of heat. Excess heat must be removed from the rack to control internal temperatures and to maintain system reliability, performance, and longevity. In a conventional rack-based computer system, rack-mounted fans move cool air through the rack to remove the excess heat and cool the components. The heated exhaust air must then be transported to a computer-room air conditioner ("CRAC") that cools the air before returning the cooled air to the data center.

In a conventional datacenter layout, racks in a data center are commonly arranged in an organized hot-aisle/cold-aisle layout to minimize the likelihood of appreciable volumes of heated exhaust air from directly re-entering the racks. A hot-aisle/cold-aisle layout may include alternating hot aisles and cold aisles, with the front of each rack sharing a cold aisle with one adjacent rack and the rear of each rack sharing a hot aisle with another adjacent rack. The CRAC supplies the cooled air to the cold aisles. The air from the cool aisle is drawn into the front of each rack and the heated air is exhausted through the rear of the rack to the hot aisle. The heated exhaust air recirculates through the CRAC to be cooled and returned back to the cold aisles.

SUMMARY OF THE INVENTION

One embodiment of the invention provides a rack assembly for cooling a computer system. The rack assembly comprises a rack providing support for one or more columns of heat-generating electronic devices and device fans for moving air from an air inlet side of the rack through the devices and through an air outlet side of the rack. The rack assembly also comprises a unitary door having a support frame spanning the air outlet side of the rack and hingedly coupling the door to a rear vertical edge of the rack. The unitary rear door includes an air-to-liquid heat exchanger panel spanning an air outlet passage inside the support frame so that substantially all of the air passing through the air outlet side of the rack must pass through the heat exchanger panel. The air outlet passage has a cross-sectional area that is substantially equal to or greater than the cross-sectional area of the multiple columns of heat-generating devices.

Another embodiment of the invention provides a data center comprising a plurality of rack assemblies for cooling a computer system. Each rack assembly comprises a rack providing support for one-or-more columns of heat-generating electronic devices and device fans for moving air from an air inlet side of the rack through the devices and through an air outlet side of the rack, and a unitary door having a support frame spanning the air outlet side of the rack and hingedly coupling the door to a rear vertical edge of the rack. The unitary door includes an air-to-liquid heat exchanger panel spanning an air outlet passage inside the support frame so that substantially all of the air passing through the air outlet side of the rack must pass through the heat exchanger panel. Furthermore, the air outlet passage has a cross-sectional area that is substantially equal to or greater than the cross-sectional area of the one-or-more columns of heat-generating devices.

Yet another embodiment of the invention provides a method comprising the steps of arranging electronic devices into at least two columns within a rack, operating the electronic devices within the rack, drawing air through an inlet to the rack to withdraw heat from the electronic devices, and passing the air through a heat exchanger panel spanning substantially across the at least two columns of the rack to remove substantially all of the heat that the air withdrew from the electronic devices before exhausting the air from and outlet the rack.

DETAILED DESCRIPTION OF PREFERRED EMBODIMENTS

Figure 1:
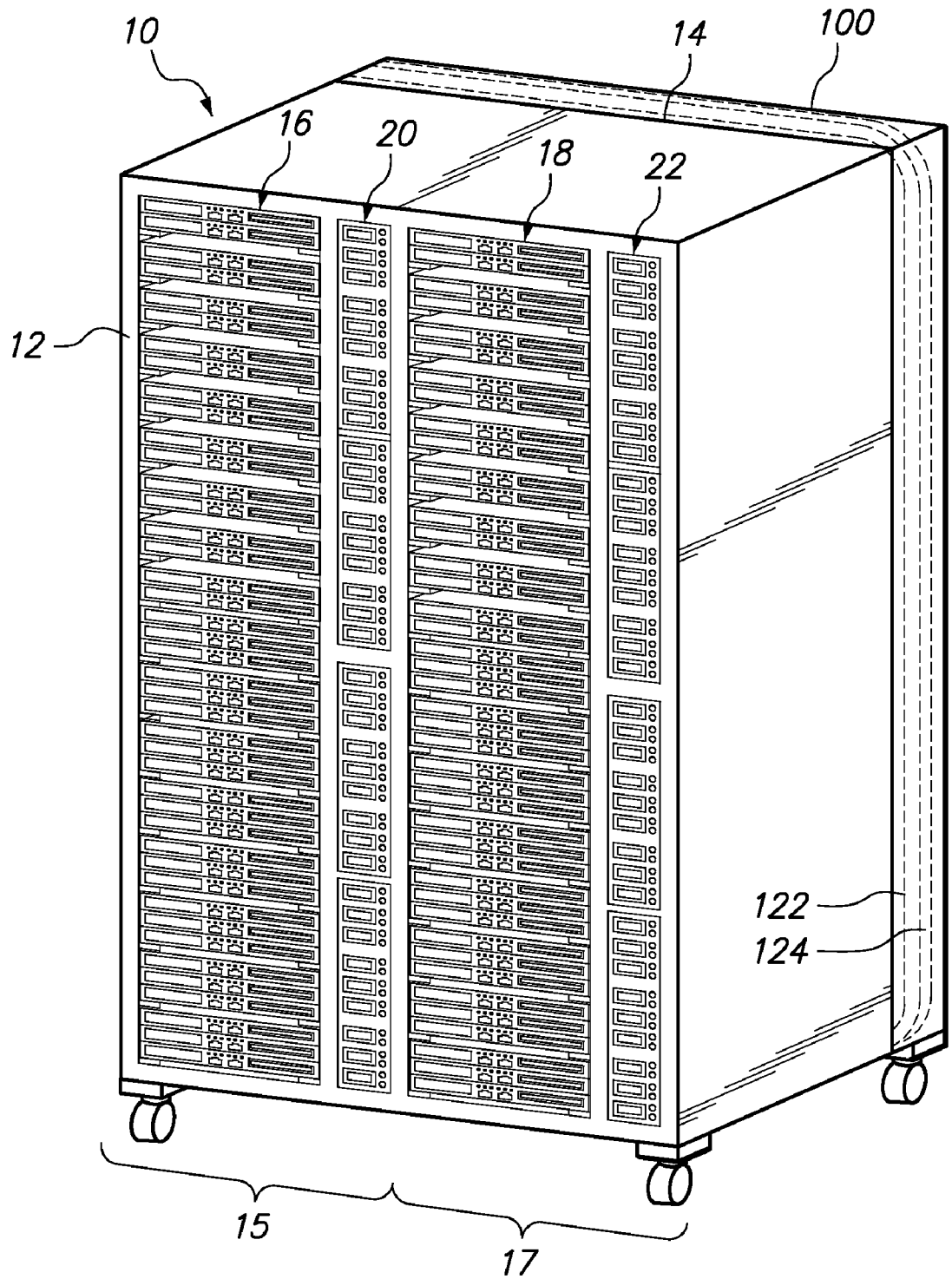
FIG. 1 is a perspective front view of a double-wide rack having an integrated rear-door heat exchanger according to one embodiment of the invention.

One embodiment of the invention is a double-wide rack with an integrated liquid-coolant rear-door heat exchanger having a cooling performance on the order of 100% heat removal. A plurality of modules is mounted in a chassis from the front of the double-wide rack. The modules are organized within two sets of high power ("primary") zones and adjacent low power ("secondary") zones. The high power zones contain primarily processor-intensive modules such as compute modules. Modules in the adjacent low power zones are low power devices such as network switches and power distribution units (PDUs) for supporting the modules in the high power zones. The modules in the low power zones are interconnected with the modules in the high power zones by cables either at the front of the double-wide rack or at the back of the rack just inside the rear-door heat exchanger.

The chassis include fans that drive airflow through the double-wide rack from the front to the rear. The efficiency and performance of the fans is enhanced by using fans that have a relatively large diameter within the constraint of the chassis physical dimensions. The rear-door heat exchanger has a low resistance to airflow, and the capacity of the chassis fans is sufficient to drive airflow exhausted from the double-wide rack through the rear-door heat exchanger without the use of external "booster" fans. The absence of booster fans results in a less expensive, quiet, energy-efficient cooling solution, with fewer parts which could potentially fail. Transferring the heat generated by the modules in the double-wide rack directly to the liquid coolant in the rear-door heat exchanger is more energy efficient than withdrawing heated air to a CRAC located at a distance from the double-wide rack to be cooled and returning the cooled air to the data center. The increased economy resulting from the air-to-liquid heat exchanger and the absence of booster fans results in a lower total cost of ownership than conventional cooling solutions, such as CRACs or heat exchangers which require booster fans.

Other embodiments of the invention are directed to improved datacenter layouts and flexibility enabled by the exceptional cooling performance of the double-wide rack and integrated rear-door heat exchanger. The double-wide racks with integrated rear-door heat exchangers are not limited to being organized in a hot-aisle/cold-aisle layout. Rather, the double-wide racks may be arranged in a more space-efficient arrangement, such as in series, such that airflow exhausted by one double-wide rack and chilled by that double-wide rack's rear-door heat exchanger may be directly provided as the inlet airflow to the next double-wide rack in series. The cooling performance of the rear-door heat exchanger provided to each double-wide rack may even be sufficient to cool the air in the data center, reducing the size and operational expense of the CRAC. As explained further below, by using liquid coolant at sufficiently low temperatures, such as water on the order of 16 degrees Celsius at a rate of 15 gallons per minute (gpm), the cooling performance of the rear-door heat exchanger may even exceed 100%, by removing more heat from the air than was transferred to the air by the heat-generating electronic devices supported on the double-wide rack. This exceptional cooling performance provided by the rear-door heat exchanger on the double-wide racks may be sufficient to cool the data center and eliminate the use of one or more remotely located conventional CRACs entirely. Overall, one or more of the embodiments of the invention may result in a lower total cost of ownership than conventional rack systems.

FIG. 1 is a perspective front view of a double-wide rack having an integrated rear-door heat exchanger 100 according to one embodiment of the invention. The double-wide rack 10 supports a plurality of modular electronic components ("modules") and provides access to the modules primarily from the front 12 of the double-wide rack 10. The rear-door heat exchanger 100 can be opened to provide access to some of the equipment in the double-wide rack 10 from the rear 14 of the double-wide rack 10. However, the equipment is accessible from the front 12 so that the rear-door heat exchanger 100 can remain closed in a cooling mode, so that substantially all of the airflow driven through the double-wide rack 10 from the front 12 to the rear 14 exits through the rear-door heat exchanger 100. The various modules are arranged with comparatively high power modules in two vertical columns referred to as "high power zones" 16, 18, and comparatively low power modules in adjacent vertical columns referred to as the "low power zones" 20, 22. The modules in the high-power zones 16, 18 are typically processor-intensive "compute modules" having a motherboard and one or more processors. The high power modules consume a large amount of electrical power as compared to the low power modules, and generate a correspondingly large amount of heat that must be removed from the double-wide rack 10 by the rear-door heat exchanger 100. The modules in the low power zones 20, 22 are typically devices for supporting the high-power modules, such as network switches for providing network connectivity and power distribution units (PDUs) for distributing power to the modules in the high-power zones 16, 18. The low power modules typically contribute a relatively small amount to the overall heat production of the double-wide rack 10.

The term "double-wide" is applied to the rack 10 because the modules are arranged in two vertical groupings 15, 17 of complimentary high-power and complimentary low-power zones. This double-wide rack configuration gives the rack 10 a unique form factor having approximately twice the width of a conventional rack having a single column of high-power modules. The rack 10 is also approximately half the depth of a conventional rack, resulting in approximately the same overall footprint. As discussed further below, the double-wide rack configuration increases the area of the airflow through the matching rear-door heat exchanger 100 for greater cooling efficiency. Although a double-wide rack 10 having multiple columns of modules is discussed in this embodiment, it should be recognized that another embodiment of the invention may have only one column of modules.

Figure 2:
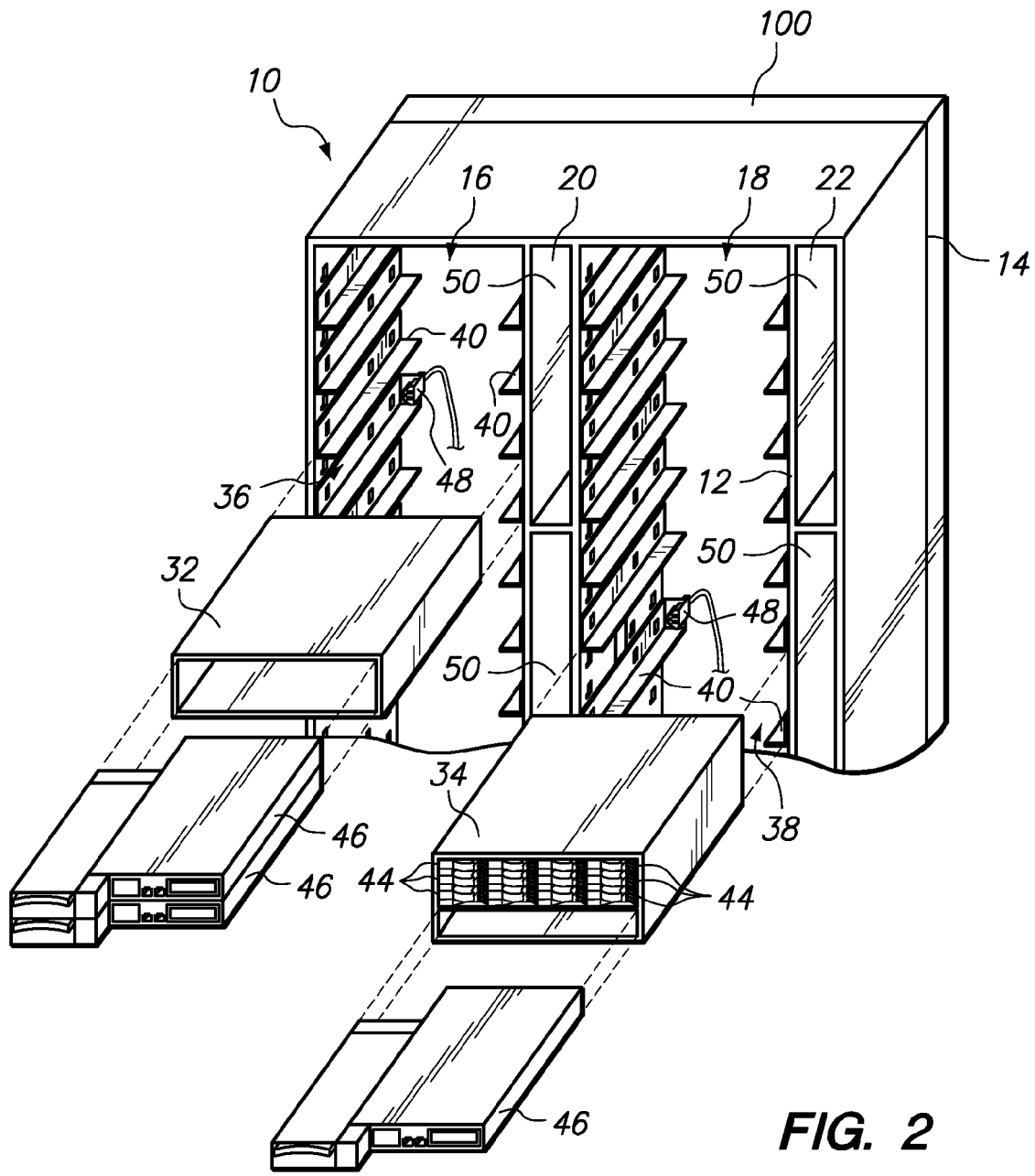
FIG. 2 is a front partial assembly view of the double-wide rack illustrating how various modules may be supported on the double-wide rack.

FIG. 2 is a front, partial assembly view of the double-wide rack 10 illustrating how various modules may be supported on the double-wide rack 10. Multiple chassis such as exemplary chassis 32, 34 are supportable on longitudinal rails 40 at different vertical locations to establish numerous "chassis bays." The rails 40 are spaced apart at different vertical positions to accommodate a number of chassis of the same or different sizes, and the vertical positions of the rails 40 may be individually adjustable. The first exemplary 2U (two unit) chassis 32 is shown being inserted into a chassis bay 36 of the high-power zone 16 on the left. A second, 3U (three unit) chassis 34 is shown being inserted into a chassis bay 38 in the high-power zone 18 on the right. The rails 40 are spaced at a first vertical distance to accommodate the 2U chassis 32 and a second, larger vertical distance to accommodate the 3U chassis 34. The lower left side rail 40 of each chassis bay secures an AC electrical connector 48 arranged to blind dock with a chassis power supply. The electrical connector 48 is aligned with a mating connector on the power supply so that complete insertion of the chassis into the respective chassis bay completes the connection and supplies electrical power to the respective chassis power supply. No access from the rear 14 of the double-wide rack 10 is necessary to complete this connection.

Each chassis has a number of openings (typically more than one) referred to as "module bays" for receiving a corresponding number of modules. The 2U chassis 32 is shown independently receiving two 1U compute modules 46. The 3U chassis 34 is shown receiving a compute module 46 in a lower 1U module bay and has already received twelve 3.5 inch disk drives 44 that are installed into drive bays that occupy the equivalent of 2U space and which are a permanent part of the chassis 34. Additional chassis having additional modules bays may be mounted on the double-wide rack 10, such that the double-wide rack 10 supports numerous modules. The modules may be selectively interconnected with cable connections from the front 12 of the double-wide rack 10. Some of the modules, such as compute modules and hard drive modules disposed in the high power bays 16, 18, may be interconnected within their common chassis.

A plurality of low power module bays 50 are provided in the low power zone 20 immediately adjacent to the high power zone 16, and in the low power zone 22 immediately adjacent to the high power zone 18. The low power module bays 50 suitably receive various low power modules, such as network switches and PDUs. The close positioning of the low power zones 20, 22 to the respective high power zones 16, 18 facilitates cable connections between the low power modules and the high power modules they support. For example, a network switch may be positioned in one of the low power module bays 50 in the low power zone 20 and connected to a compute module 46 at the same vertical position in the high power zone 16 to connect that compute module 46 to the network switch. The close positioning of the network switch to the compute module 46 minimizes the physical length of network connections made between the network switch and the compute module 46, and avoids interfering with other modules located elsewhere in the double-wide rack 10. Having these cables and connections in the front of the rack makes configuration easier and does not require access to the back of the rack. Still further, positioning the lower power module bays 20, 22 consistently to one side of the respective high power zones 16, 18 make cabling even more convenient and manageable.

Figure 3:
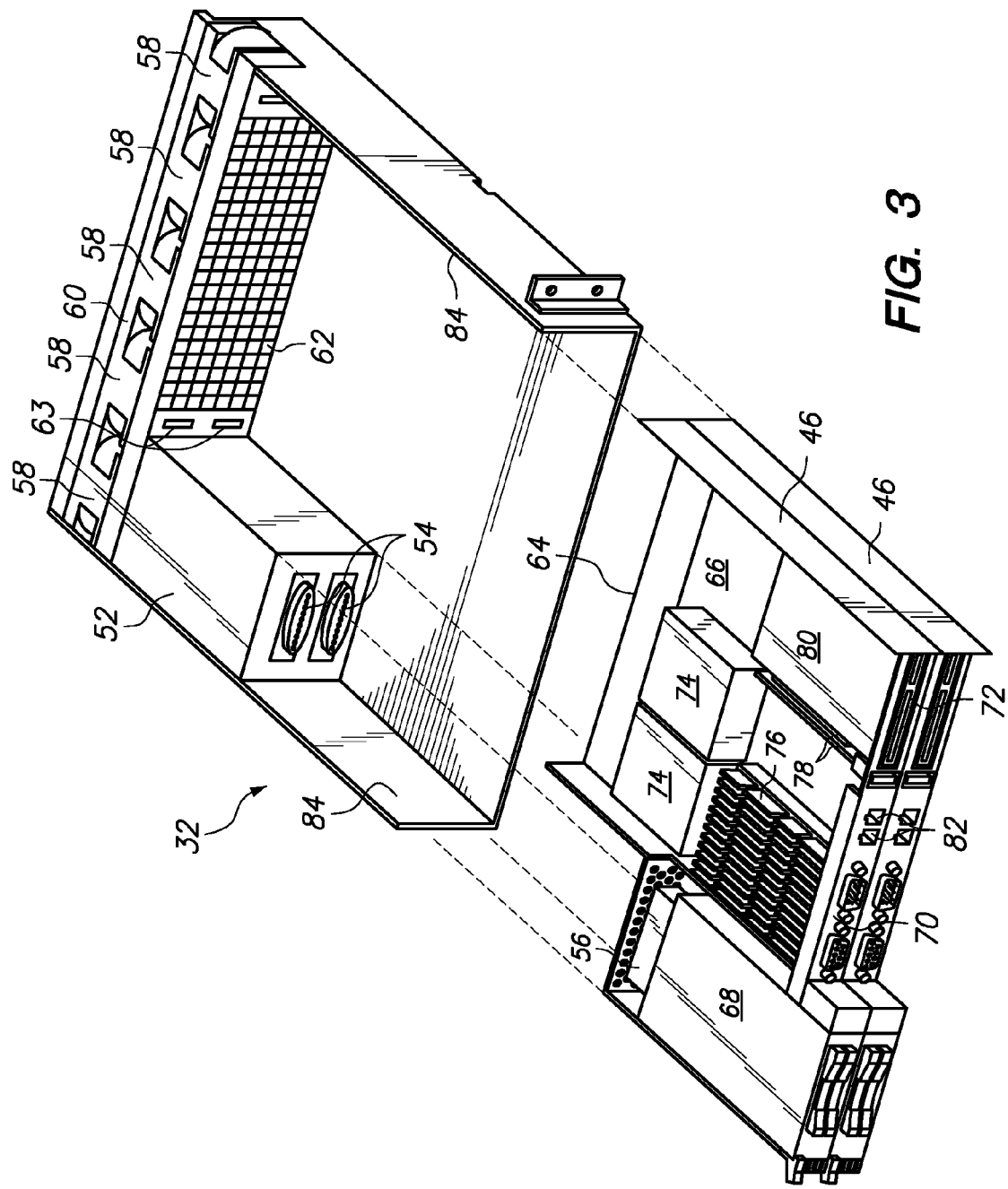
FIG. 3 is a schematic partial assembly view of an exemplary chassis receiving the two compute modules.

FIG. 3 is a schematic partial assembly view of the exemplary chassis 32 receiving the two compute modules 46, wherein the chassis and upper compute module each have a top cover removed to show the components therein. The 2U chassis 32 includes a power supply 52 having two front-facing connectors 54 for direct blind docking with mating connectors 56 on the compute modules 46. The two compute modules 46 are preferably independently aligned and inserted into the chassis 32. Optionally, a single compute module may be installed or two compute modules may be installed separately. Each individual compute module 46 includes a tray 64, a rearward facing power connector 56, a motherboard 66, a hard disk drive 68, an input/output panel 70, and a PCI slot 72. The motherboard 66 is preferably an industry standard motherboard, which may include a pair of processors 74, a plurality of memory modules 76, a riser card 78 and a PCI card 80. Other components known in the art may also be included with the motherboard 66. The input/output panel 70 includes standard network connectors, such as Ethernet connectors 82, which can be used to connect the motherboard 66 to a network switch disposed in one of the low power module bays 50 (see FIG. 2) using an Ethernet cable. For purposes of this disclosure it is assumed that each compute module is similarly equipped although the number and types of components may vary. Upon insertion into the chassis 32, the compute modules 46 are guided rearward along the side walls 84 of the chassis 32 until a rearward facing power connector 56 on each the two compute modules 46 have blind docked with one of the two front-facing connectors 54 on the power supply 52. The vertical and lateral spacings of the front-facing connectors 54 and the rearward-facing connectors 56 are the same to facilitate their connection. Accordingly, the motherboard 66, hard disk drive 68 and other components of each compute module 46 are supplied with power.

Figure 4:
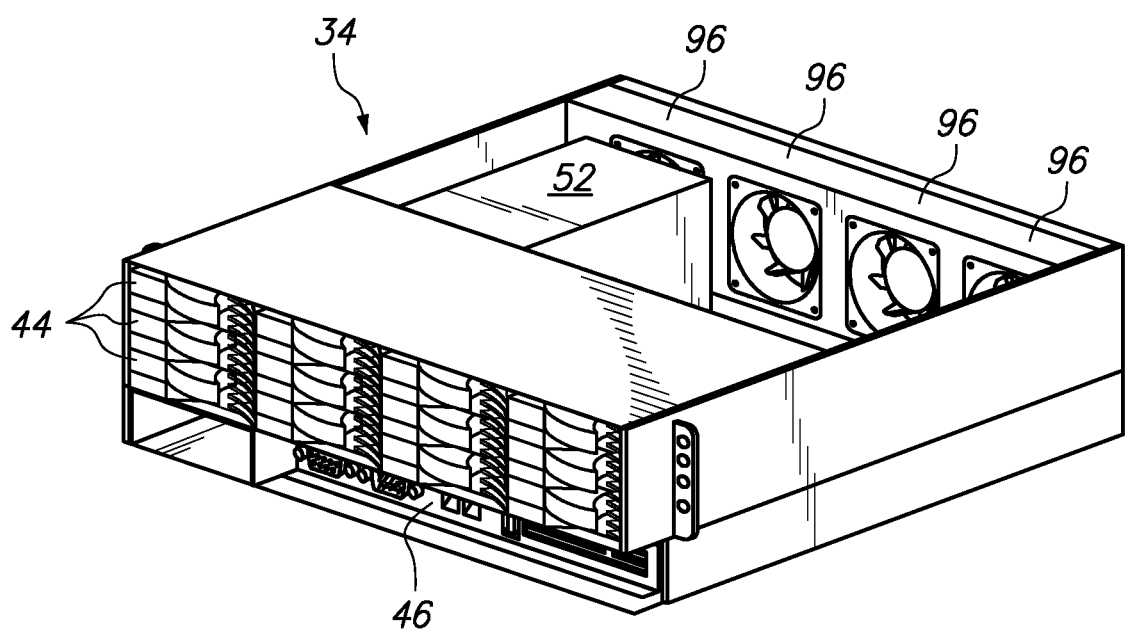
FIG. 4 is a perspective view of a 3U chassis with the top panel removed.

Each chassis in the double-wide rack 10 (see FIG. 1) may include a fan assembly for generating airflow through that chassis. The term "fan" includes "blowers" and other devices for producing a current of air. Referring again to FIG. 3, the 2U chassis 32 includes five fans 58 (including one fan for the power supply), four of which are secured in a fan assembly 60 having an air intake grill 62. The fan assembly 60 may be directly powered and controlled by the power supply 52 according to thermal sensor data passed to it from the compute module 46. Although the number of fans may vary, the 2U chassis 32 can accommodate larger diameter fans than a 1U chassis due to the 2U height. An even larger chassis can support even larger fans. For example, FIG. 4 is a perspective view of the 3U chassis 34 with the top panel removed for clarity. The 3U chassis 34 has four fans 96 (also including the fan in the power supply) that may each be larger than the fans 58 in the 2U chassis of FIG. 3. Even larger diameter fans could be used in larger chassis (e.g. a 4U chassis and larger), within the limits of the chassis physical dimensions. The use of larger fans may provide more efficient air flow, even in cases wherein the larger fan diameter dictates the use of fewer fans. The fan assembly in each chassis generates airflow for cooling that chassis. Collectively, the numerous fans included among the plurality of chassis in the double-wide rack 10 provide sufficient airflow to cool the individual chassis and also to move the air through the rear-door heat exchanger 100 to cool the airflow exiting the double-wide rack 10 of FIG. 1 without the use of any additional, outboard booster fans. The absence of booster fans results in quieter and more economical operation of the rack, with fewer parts which could ultimately fail.

Figure 5:
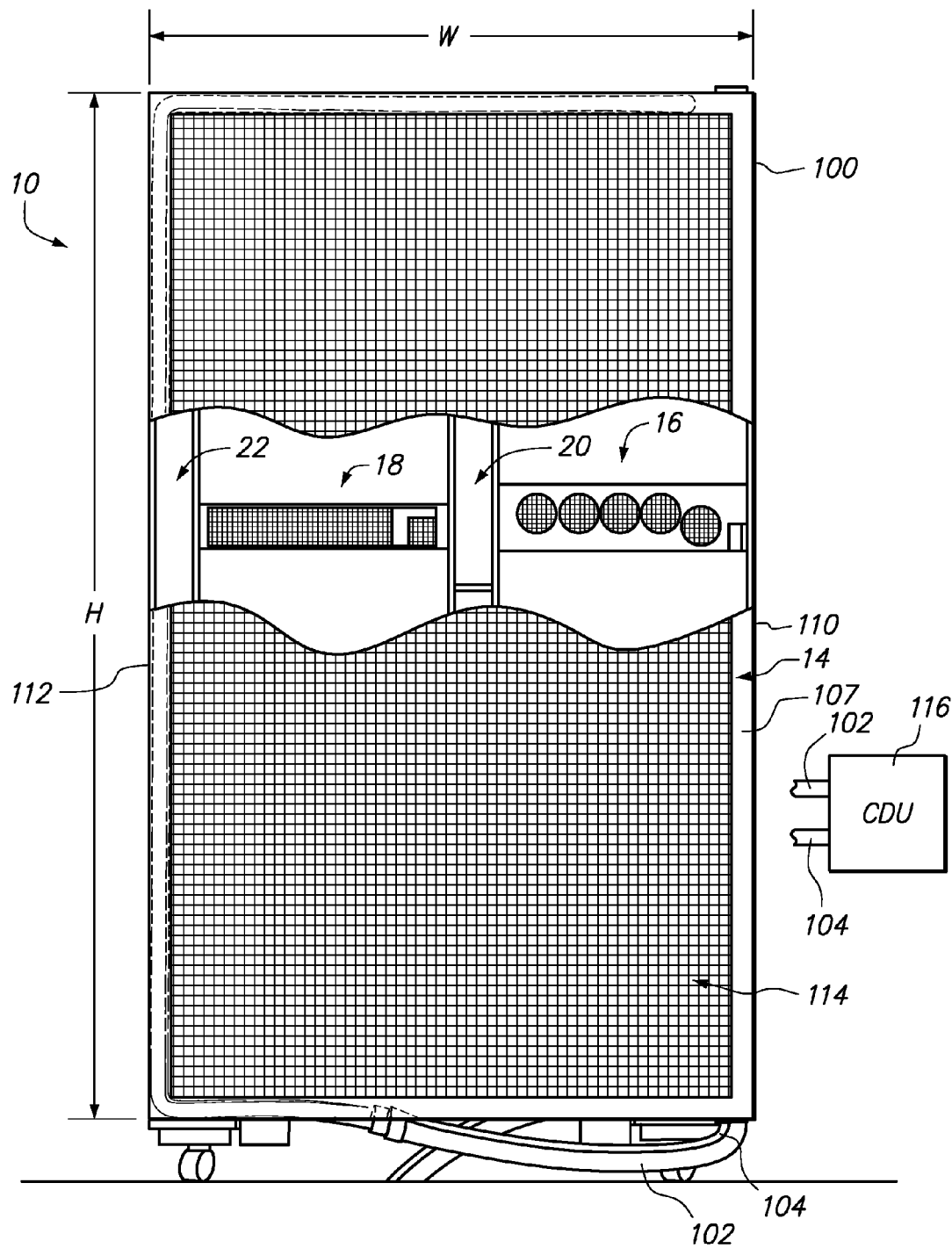
FIG. 5 is a rear elevation view of the double-wide rack with a partially cut-away view of the rear-door heat exchanger.

FIG. 5 is a rear elevation view of the double-wide rack 10 with a partially cut-away view of the rear-door heat exchanger 100. A hinged edge 110 of the rear-door heat exchanger 100 is pivotably connected to the double-wide rack 10 by a hinge 107 at a hinged end, and may be opened like a door from a free end 112. The fans included with the plurality of chassis (see the discussion of FIGS. 3 and 4) drive airflow from the front of the double-wide rack 10 through the rear 14 of the double-wide rack 10, and out through the rear-door heat exchanger 100. A supply hose 102 supplies the rear-door heat exchanger 100 with a liquid coolant, such as water, from a coolant distribution unit ("CDU"). As heated air exiting the double-wide rack 10 passes through the rear-door heat exchanger 100, heat from the air is transferred to the coolant, which cools the air exiting the rear-door heat exchanger 100. The heated coolant is returned to the CDU 116 via a return hose 104. The fluid circulates back through the CDU 116 to chill the coolant before the coolant is returned to the rear-door heat exchanger 100 through the supply hose 102. The hoses 102, 104 are routed under the rear-door heat exchanger 100 so that the rear-door heat exchanger 100 extends along substantially the entire height H of the double-wide rack 10, to prevent any airflow losses (e.g. impedance or leakage) that may otherwise result were the hoses 102, 104 to be routed in front of some of the modules.

The cutaway portion of the double-wide rack in FIG. 5 reveals the double-wide arrangement of the modules with the two vertically-oriented high power zones 16, 18 and the two adjacent, vertically-oriented low power zones 20, 22, as viewed from the rear 14. The rear-door heat exchanger 100 spans the entire width W of the double-wide rack, resulting in a heat-exchanger with an effective width (i.e., the width that is actively involved in cooling) that is more than twice the effective width of a heat exchanger on a conventional "single wide" rack having a single vertical column of high power modules. This increased width of the rear-door heat exchanger 100 in combination with the reduced depth of the rack 10 contributes to improved cooling capacity as compared with conventional means of cooling racks. The coolant flow rate through the rear-door heat exchanger 100 may be increased accordingly (e.g. doubled) to account for the increased width of the rear-door heat exchanger 100. As further explained below, the rear-door heat exchanger 100 may remove up to 100% or more of the quantity of heat that was added to the airflow by the modules in the double-wide rack 10.

Figure 6:
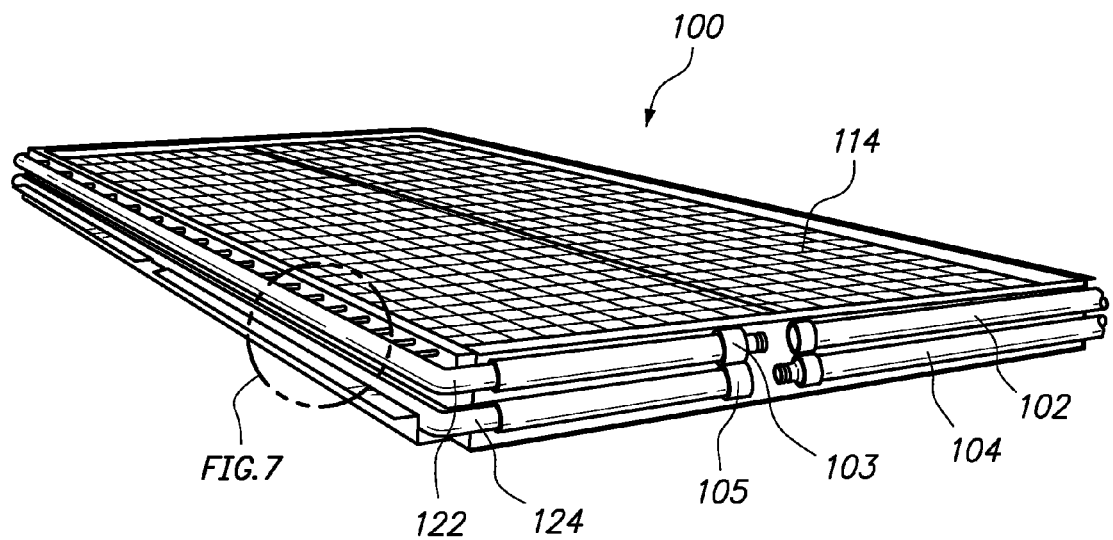
FIG. 6 is a perspective view of the rear-door heat exchanger from below.

FIG. 6 is a perspective view of the rear-door heat exchanger 100 from below. The supply hose 102 and return hose 104 are coupled to an inlet manifold 122 and an outlet manifold 124 along the bottom edge of the rear-door heat exchanger 100 via a corresponding pair of schematically-represented "quick-connect" couplers 103, 105. The quick connect coupler 103 places the supply hose 102 in fluid communication with the inlet manifold 122, and the quick-connect coupler 105 places the return hose 104 in fluid communication with the outlet manifold 124. The rear-door heat exchanger 100 includes a fin tube assembly 114 through which airflow passes. The inlet manifold 122 provides chilled coolant flow to the fin tube assembly 114, and the outlet manifold 124 receives heated coolant after it has passed through the fin tube assembly 114.

Figure 7:
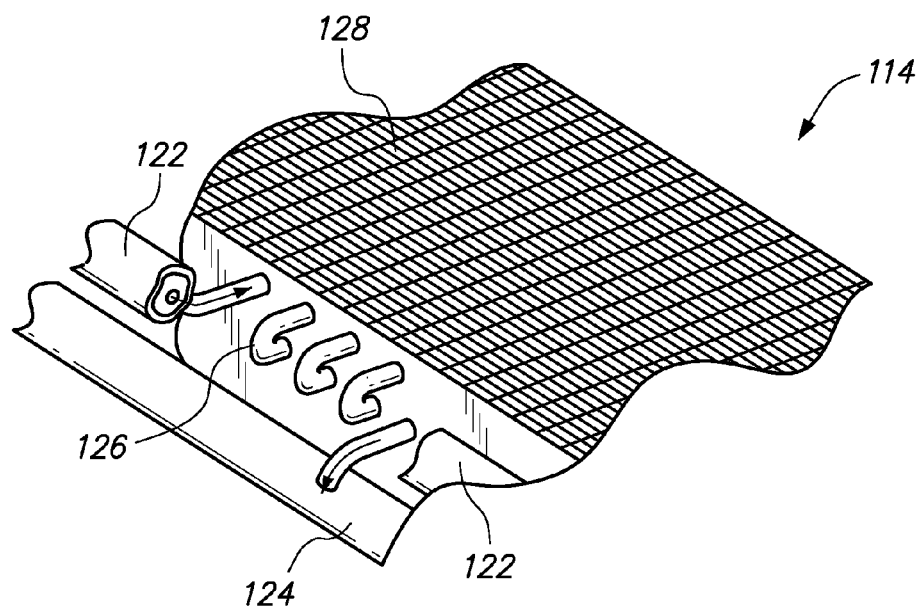
FIG. 7 is a sectioned view of a portion of the fin tube assembly used in the rear-door heat exchanger.

FIG. 7 is a sectioned view of a portion of the fin tube assembly 114. The fin tube assembly 114 includes a plurality of tubes 126 (only one complete tube 126 shown) that pass through the rear-door heat exchanger 100 in a serpentine fashion, circulating chilled coolant from the inlet manifold 122 to the outlet manifold 124 under the force of an external pump (not shown) within the CDU. The inlet 122 and outlet manifolds 124 include multiple parallel tube branches having their own inlets and outlets as depicted in FIG. 7. The tubes are in direct thermal communication and contact with a plurality of cooling fins 128 that collectively provide a large surface area in contact with the airflow that passes through the rear-door heat exchanger 100.

Figure 8:
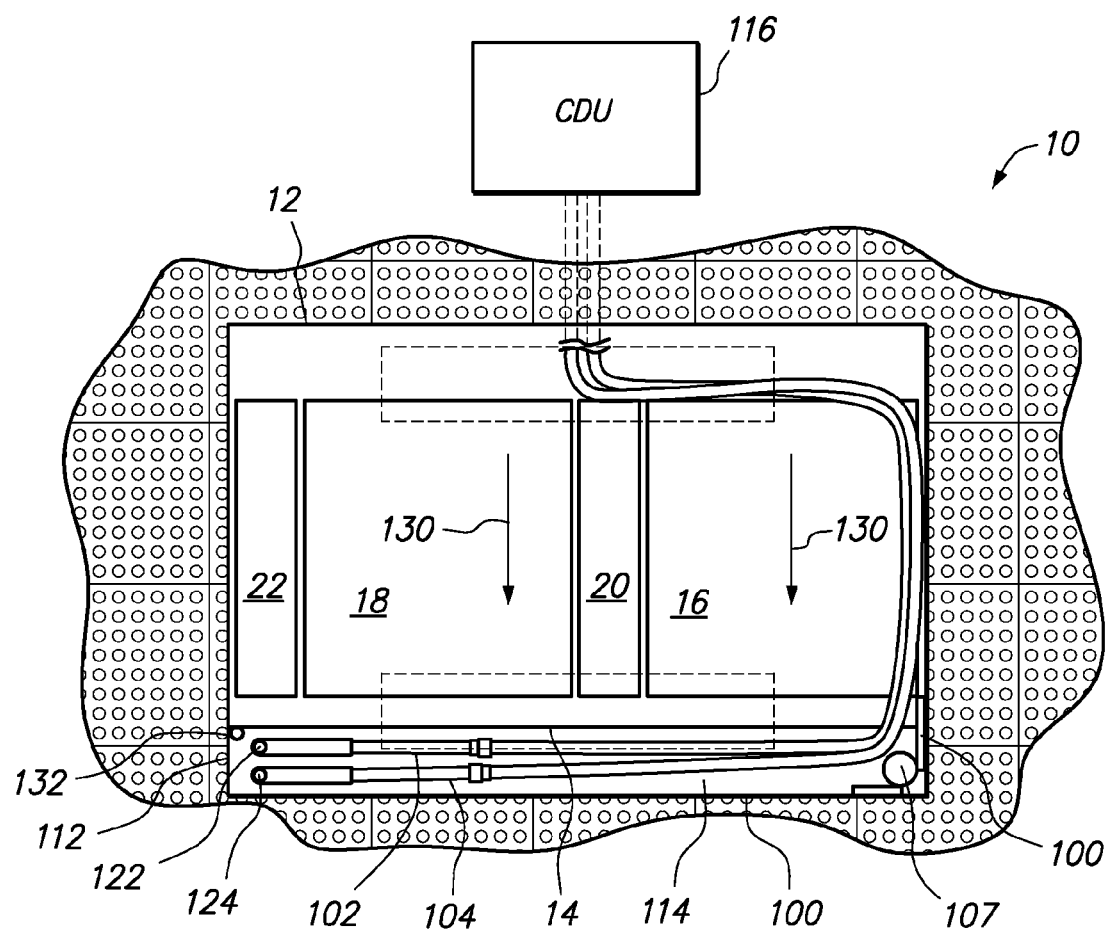
FIG. 8 is a plan view of the double-wide rack with the rear-door heat exchanger in a closed position.

FIG. 8 is a plan view of the double-wide rack 10 with the rear-door heat exchanger 100 in a closed position. In the closed position, the rear-door heat exchanger 100 is flush with the rear 14 of the double-wide rack 10, and the direction of the airflow through the fin tube assembly 114 is generally perpendicular to the plane of the rear-door heat exchanger 100, as generally indicated by the arrow 130. It should be recognized that the rack 10 will typically include a rear door in order to provide security, give the rack a more desirable appearance, and provide electromagnetic compatibility (EMC) shielding. The rear-door heat exchanger 100 of the embodiment shown is provided within the dimensions of the rack door and does not cause an increase in the rack footprint.

A seal 132, such as a gasket, may be provided at least near the free end 112 of the rear-door heat exchanger 100. The seal 132 may extend along a portion or the entirety of the perimeter of the rear-door heat exchanger 100, between the rear-door heat exchanger 100 and the double-wide rack 10. The seal 132 helps constrain the airflow exiting the double-wide rack 10 to flow substantially entirely through the rear-door heat exchanger 100 by preventing or reducing airflow leakage that may otherwise result in decreased cooling performance. All horizontal and vertical openings in the rack are filled with either the electronic modules or with filler panels so that hot air exiting the rear of the electronics modules can not recirculate, i.e. traverse to the front of the rack and re-enter the electronics.

As shown in the rear view of FIG. 8, the secondary zones 20, 22 that produce less heat are positioned to the left of the primary zones 18, 16, respectively, that produce greater amounts of heat. Although this arrangement was previously described as providing a convenient cabling arrangement along the front 12, there are additional advantages in the back 14. First, this arrangement aligns the left-most secondary zone 22 with the heat exchanger manifolds 122, 124 which do not have fins. In this manner, an area of the heat exchanger that performs less cooling is aligned to receive the air flow from an area of the rack where components are generating less heat. Second, this arrangement also positions the most commonly serviced modules, such as PDUs and network switches, closer to the opening side of the door (farthest from the hinge), relative to each zone of modules 16, 18.

Figure 9:
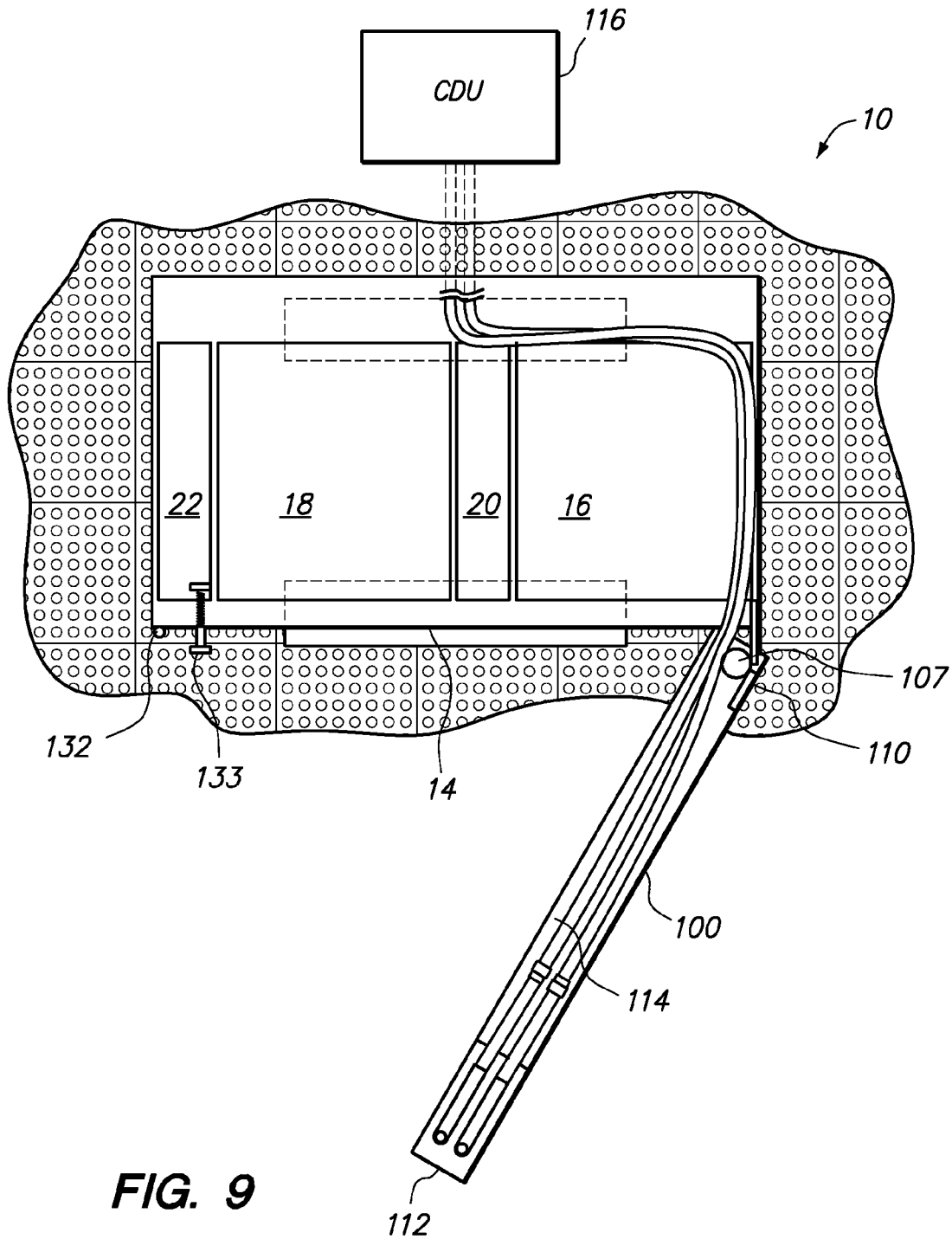
FIG. 9 is a plan view of the double-wide rack with the rear-door heat exchanger pivoted to a partially open position.

FIG. 9 is a plan view of the double-wide rack 10 with the rear-door heat exchanger 110 pivoted to a partially open position. The rear-door heat exchanger 100 may be opened like a door from the free edge 112 opposite the hinged edge 110, by pivoting the rear-door heat exchanger 100 on the hinge 107. The rear-door heat exchanger 100 may be opened, for example, to access some components of the double-wide rack 10 from the rear 14 of the double-wide rack 10. However, as explained above, access to the various modules supported on the double-wide rack 10 is primarily provided from the front of the double-wide rack 10 to minimize the need to open the rear-door heat exchanger 100.

Opening the rear-door heat exchanger 100 as shown in FIG. 9 temporarily reduces the cooling of the air in the datacenter because airflow through the double-wide rack 10 is not constrained to flow through the rear-door heat exchanger 100 when opened. Thus, before opening the rear-door heat exchanger 100 for an extended period of time, such as for more than a few minutes, it may be recommended to induce a reduced power consumption mode, at least for the modules in the high power zones 18, 20. For example, a sleep state or throttled condition may be induced in the processors of the various modules mounted in the double-wide rack 10, or some or all of the modules may be turned off completely. The reduced power consumption mode may be manually induced by datacenter personnel or automatically induced, such as in response to an optional switch 133 being activated or deactivated as a result of opening the rear-door heat exchanger 100. The switch 133 may be in electronic communication with a management module (not shown) for controlling the power state of the various modules.

While inducing a reduced power mode for some of the equipment is generally recommended when the rear-door heat exchanger 100 is open, it should be noted that the numerous on-board cooling fans (see FIGS. 3 and 4) will provide sufficient airflow to cool the double-wide rack 10 even while the rear-door heat exchanger 100 is open. The concern with operating the modules while the Rear-door heat exchanger 100 is open is related more to the potential effect on the ambient air temperatures. As discussed further below, the double-wide rack cooling performance provided by the embodiments of the invention presented herein enable new datacenter configurations wherein multiple double-wide racks are arranged in series, such that air exhausted by the double-wide rack 10 and cooled by the rear-door heat exchanger 100 may be provided as inlet airflow to an adjacent double-wide rack. Thus, once a datacenter has been designed in reliance upon the cooling of the heat exchanger, operating the double-wide rack 10 while the rear-door heat exchanger 100 is open may adversely affect the cooling of adjacent double-wide racks by elevating the intake temperature of airflow to the adjacent double-wide racks.

The double-wide door provides more than twice the width of a single-side door, because the effective cooling area of the heat exchanger does not include the door frame. As the width of the door is increases, the door frame represents a decreasing proportion of the door. For example, a double-wide rack could be fitted with two single-wide rear door heat exchangers. However, the two single wide doors would have non-cooling door frames extending along all sides of each door. This would put two non-cooling vertical frames right in the middle of the rack. By using a single, double-wide rear door heat exchanger, the area that would be blocked by the non-cooling vertical frames is replaced by cooling fins. This represents a significant increase in the amount of cooling that the rear door heat exchanger can achieve. In addition, using a single door (rather than two side-by-side doors) provides better access into the rack in the sense that when the door is opened and blocking an aisle, the user can still walk along the aisle to and from the back of the rack from one side. It should be recognized that the rear door heat exchanger can be hinged on either side of the rack, including the left side (not shown), but the arrangement of the rack zones would preferably also be reversed to maintain the beneficial access and cooling relationships described above.

Figure 10:
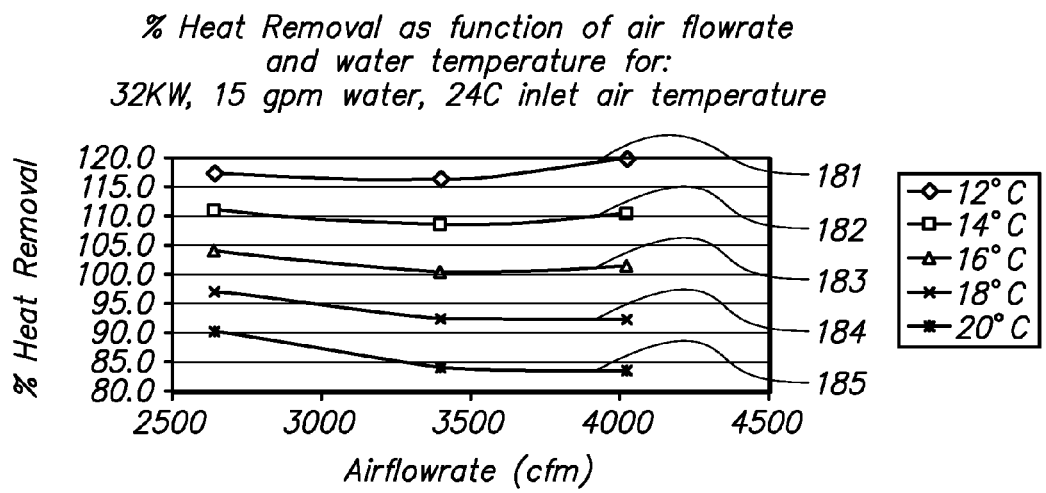
FIG. 10 is a graph indicating some representative performance curves for a combination double-wide rack and rear-door heat exchanger.

FIG. 10 is a graph indicating some representative performance curves for a combination double-wide rack and rear-door heat exchanger according to an embodiment of the invention. Water is used as the coolant in this example. Five exemplary performance curves 181, 182, 183, 184, 185 are shown. Each performance curve plots the cooling performance (expressed as percentage heat removal) versus airflow rate for a particular water coolant temperature ranging from 12 Celsius (12 C.) to 20 C. as indicated. The cooling performance values exceed 100% at several points in the graph, indicating that more heat is removed from the airflow by the rear-door heat exchanger than was added to the airflow passing through the double-wide rack.

Achieving a cooling performance approaching or exceeding 100% heat removal results in the rear-door heat exchanger exhausting air back into the data center at temperatures near or even less than the mean ambient temperature of the data center. The use of the air-to-liquid heat exchanger on each rack, therefore, significantly reduces the thermal load on the CRACs, and possibly eliminates the need for the CRACs. The use of the air-to-liquid heat exchanger on each rack provides sufficient cooling for more equipment in a data center and/or for more equipment on each rack, such that rack density may be increased without increasing the capacity of the CRAC.

The enhanced cooling performance of the rear-door heat exchanger also enables new datacenter layouts and configurations that may depart from a conventional cold-aisle/hot-aisle layout. Data center cooling challenges may be overcome with the addition of a rear-door heat exchanger to one or more of the racks in the data center, and the resulting freedom to reconfigure a data center layout without constructing a facility from scratch. Racks with integrated rear-door heat exchangers according to an embodiment of the invention can individually replace selected racks throughout the data center, as needed. For example, a rack with integrated rear-door heat exchanger may be individually substituted for a conventional rack, where the rack and/or the data center have a history of cooling difficulties. The cooling difficulties with the conventional rack may arise, for example, due to having a high power density (in terms of the number of modules per rack), or due to "hot spots" within the data center where the three-dimensional distribution of chilled air from a CRAC within the data center makes cooling the rack difficult. Alternatively, groups of racks or even all of the racks in the entire data center can be replaced. Data centers often have sections associated with very high power density and those with much lower power density. Hence, one or more racks with an integrated rear-door heat exchanger can replace regions of the data center having racks with high power density.

Figure 11:
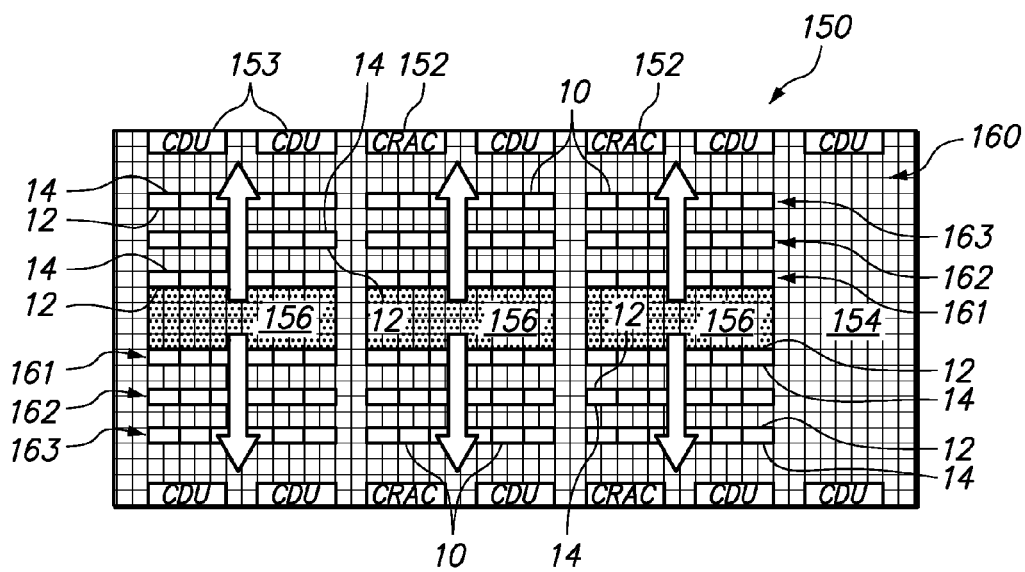
FIG. 11 is a plan view of one exemplary new datacenter configuration enabled by the improved cooling performance of the double-wide rack with integrated rear-door heat exchanger.

FIG. 11 is a plan view of one exemplary new data center configuration 150 enabled by the improved cooling performance of the double-wide rack with integrated rear-door heat exchanger 10. The data center configuration 150 includes a plurality of CRACs 152 and CDUs 153 around the perimeter of a data center 160. Fewer CRACs are needed than in a conventional data center configuration. A raised floor 154 is provided having perforated tiles known in the art. Air is circulated from the CRACs 152, underneath the raised floor 154, up through perforated tiles in a central cool-air region 156. Water is circulated from the CDUs 153, underneath the raised floor 154, up through cutouts in the tiles to the rear door heat exchangers. A plurality of the double-wide racks 10 with integrated heat exchangers are arranged in rows disposed around the central cool-air regions 156. The rows are labeled 161, 162, 163 in order of increasing distance from the central cool-air regions 156. Three rows 161-163 are shown on each side of the data center 160, by way of example, though a different number of rows may be included.

The double-wide racks 10 in the row 161 nearest the cool air regions 156 have their front (inlet side) 12 facing the cool-air regions 156 to receive cooled air from the cool-air regions 156. Because the air exhausted from the outlet sides 14 of the double-wide racks 10 are cooled by the rear-door heat exchanger integrated with the double-wide racks 10, the air exiting the outlet sides 14 of the double-wide racks 10 is sufficiently cooled by the rear-door heat exchangers to supply air to the inlet side 12 of the subsequent double-wide rack in series. Thus, contrary to conventional hot-aisle/cold-aisle configurations, the rows 161-163 are arranged in series such that the air inlet side 12 of one double-wide rack faces the rear (air outlet side) 14 of another double-wide rack 10. For example, the air inlet sides 12 of the double-wide racks 10 in the row 162 face and receive air exhausted from the air outlet sides 14 of the double-wide racks 10 in row 161, and the air inlet side 12 of double-wide racks 10 in the row 163 face and receive air exhausted from the air outlet side 14 of the double-wide racks 10 in the row 162. The air exhausted from the double-wide racks 10 in rows 163 enters the CRACs 152, in case the air exhausted from row 163 has been progressively warmed by the double-wide racks 10. If the exhaust air has not been progressively warmed by the time it exhausts from the row 163, the CRACs 152 may be operated in a pure recirculation mode to simply recirculate the air to the cool air regions 156 without cooling the air.

For equivalent heat removal capacities, the electrical energy required to run a CDU is dramatically lower than that for a CRAC. A CDU consumes only about a third of the power consumed by a CRAC for the equivalent cooling capacity. Hence, the electrical power requirements and associated cooling costs are incrementally reduced with each CRAC that is replaced by a CDU in the data center. Although this describes a data center configuration with air and water entering from beneath the floor, this configuration could also be used with overhead delivery of the air and water.

Figure 12:
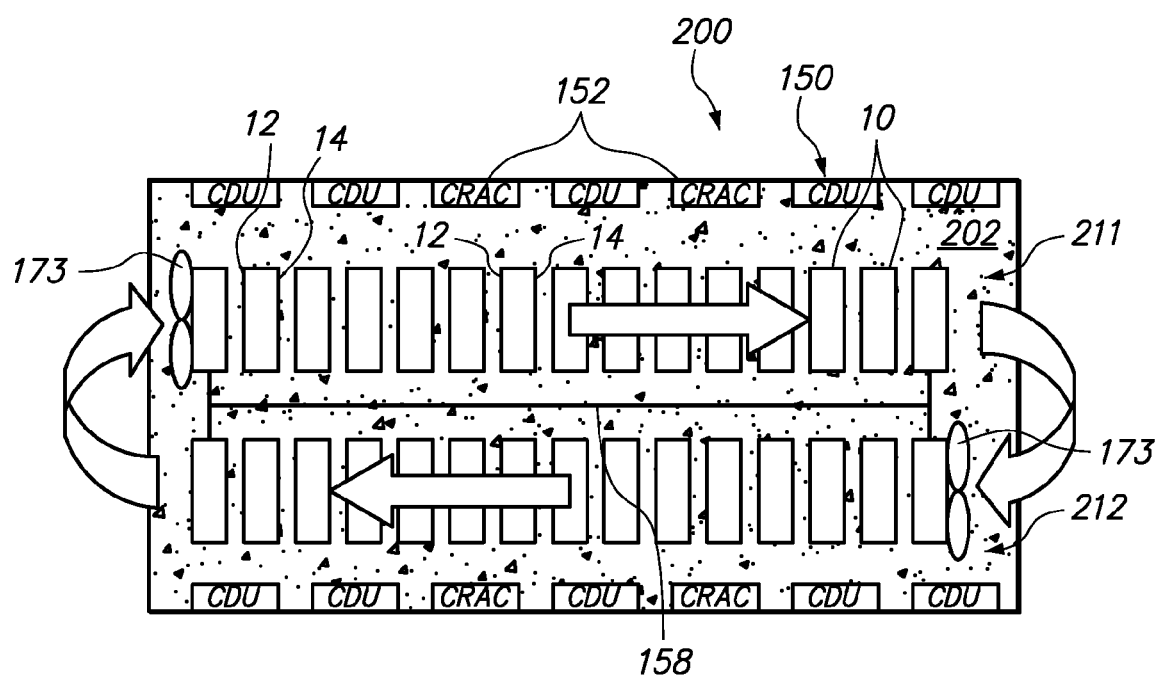
FIG. 12 is a plan view of another exemplary new datacenter configuration.

FIG. 12 is a plan view of another exemplary new data center configuration 200 built on a slab-floor 202 instead of a raised floor. The more expensive raised floor has been eliminated in this embodiment by virtue of the improved cooling performance of the double-wide racks 10 with integrated heat exchangers. The double-wide racks are serially arranged in long columns 211, 212 along the length of the data center 210. The optional CRACs 152 are shown in case some level of optional cooling is desired. The two columns 211, 212 each have, by way of example, fifteen rows of the double-wide racks 10. The double-wide racks 10 in column 211 are arranged serially from one end of the room to the other, with the exhaust side 14 of each double-wide rack facing the inlet side 12 of the next double-wide rack 10 in series. Thus, air is circulated along the column 211 all the way across the room, and then circulated in the reverse direction along the column 212, creating a generally clockwise air circulation in the data center. An optional barrier, curtain or lightweight wall 158 may be positioned to separate the two columns. Also, optional fans 173 may be located at each end to facilitate the turning of the air. Because the cooling performance of the rear-door heat exchanger provided with each double-wide rack 10 approaches or exceeds 100% heat removal, the air may be continuously circulated in the data center, without necessarily being transported to the CRACs 152 optionally provided. Eliminating the need for the CRACs eliminates the need for the raised floor environment. Similarly with reduced CRAC requirements the CRAC air can be provided overhead, also eliminating the need for the raised floor environment. The slab floor 202 is much more economical to construct than a raised floor. Although this describes a data center configuration with air and water entering from overhead, this configuration could also be used with under the floor delivery of the air and water.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A rack assembly for cooling a computer system, comprising:
   a rack providing support for one-or-more columns of heat-generating electronic devices, a further column supporting heat-generating electronic devices that generate less heat than the heat-generating electronic devices supported in the one or more columns, and device fans for moving air from an air inlet side of the rack through the heat-generating electronic devices and through an air outlet side of the rack;
   a unitary door having a support frame spanning the air outlet side of the rack and hingedly coupling the door to a rear vertical edge of the rack, wherein the unitary door includes an air-to-liquid heat exchanger panel spanning an air outlet passage inside the support frame so that substantially all of the air passing through the air outlet side of the rack must pass through the heat exchanger panel, and wherein the air outlet passage has a cross-sectional area that is substantially equal to or greater than the cross-sectional area of the one-or-more columns of heat-generating electronic devices, the air-to-liquid heat exchanger panel further having a coolant liquid inlet manifold and a coolant liquid outlet manifold extending along a vertical side of the support frame opposite the hinged coupling, wherein the coolant liquid inlet manifold and coolant liquid outlet manifold are substantially aligned with the further column.

2. The rack assembly of claim 1, further comprising:
   a sealing element securing to the support frame to reduce or prevent air leakage between the unitary door and the air outlet side of the rack.

3. The rack assembly of claim 1, wherein the air-to-liquid heat exchanger panel has a capacity that is sufficient to remove all of the heat generated by the heat-generating electronic devices within the one-or-more columns of the rack.

4. The rack assembly of claim 1, wherein the air-to-liquid heat exchanger panel has a coolant liquid inlet manifold and a coolant liquid outlet manifold, and wherein the inlet and outlet manifolds extend along a vertical side of the support frame opposite the hinged coupling.

5. The rack assembly of claim 1, wherein the one or more columns support heat-generating electronic devices in a horizontal orientation and the further column supports heat-generating electronic devices in a vertical orientation.

6. The rack assembly of claim 1, further comprising one vertically oriented column positioned adjacent each of the one or more columns in a direction away from the hinged coupling.

7. The rack assembly of claim 1, wherein the device fans move the air through the heat exchange panel without any fans dedicated to increasing air flow through the heat exchanger.

8. The rack assembly of claim 1, wherein the inclusion of the air-to-liquid heat exchanger panel in the unitary door does not increase the footprint of the rack assembly.

9. The rack assembly of claim 1, wherein the air-to-liquid heat exchanger removes heat more efficiently than a computer room air conditioner.

10. The rack assembly of claim 1, wherein the one or more columns is at least two columns.

11. A data center, comprising:
    a plurality of rack assemblies, each rack assembly comprising (a) a rack providing support for one or more columns of heat-generating electronic devices and device fans for moving air from an air inlet side of the rack through the heat-generating electronic devices and through an air outlet side of the rack, and (b) a unitary door having a support frame spanning the air outlet side of the rack and hingedly coupling the door to a rear vertical edge of the rack, wherein the unitary door includes an air-to-liquid heat exchanger panel spanning an air outlet passage inside the support frame so that substantially all of the air passing through the air outlet side of the rack is constrained to pass through the heat exchanger panel, and wherein the air outlet passage has a cross-sectional area that is substantially equal to or greater than the cross-sectional area of the one or more columns of heat-generating electronic devices; and (c) liquid coolant flow and return paths routed along a vertical edge of the door to and from the air-to-liquid heat exchanger panel.

12. The data center of claim 11, wherein the combined cooling capacity of the air-to-liquid heat exchanger panel in the plurality of rack assemblies exceeds the maximum heat-generation of the data center.

13. The data center of claim 12, further comprising a data center air conditioning system remote from the plurality of rack assemblies, wherein the heat exchanger panels and data center air conditioner system are simultaneously operable.

14. The data center of claim 11, wherein the plurality of rack assemblies are arranged in rows with the rear of the racks in a first row facing the front of the racks in a second, adjacent row.

15. The data center of claim 11, wherein the plurality of rack assemblies are arranged in a series of rows with the rear of the racks in a first row facing the front of the racks in a second adjacent row.

16. The data center of claim 15, wherein the series of rows are positioned to continuously circulate air around the data center.

17. The rack assembly of claim 11, wherein the one or more columns is at least two columns.

18. A method comprising:
- arranging heat-generating electronic devices into at least two columns within each of a plurality of racks;
- operating the heat-generating electronic devices within each rack;
- drawing air through the rack from the air inlet side of each rack to the an air outlet side of each rack to transfer heat from the electronic devices to the air;
- passing the air through a heat exchanger panel spanning substantially across the at least two columns of each rack to remove substantially all of the heat transferred from the heat-generating electronic devices to the air; and
- flowing liquid coolant vertically along a vertical edge of each rack to and from each heat exchanger panel.

19. The method of claim 18, further comprising:
- arranging a plurality of the racks in rows with the rack outlets of a first row facing the rack inlets of an adjacent second row.

20. The method of claim 19, further comprising:
- circulating the air from first row to the second row without introducing the air to a data center air conditioner.

21. The method of claim 18, further comprising:
- positioning the rack within a data center with a data center air conditioner that does not have sufficient available capacity to cool the heat-generating electronic devices.

22. The method of claim 18, further comprising:
- circulating the liquid to a coolant distribution unit.

23. The method of claim 22, further comprising:
- operating the coolant distribution unit instead of a computer room air conditioner.

* * * * *